United States Patent
Lu et al.

(10) Patent No.: US 8,759,876 B2
(45) Date of Patent: Jun. 24, 2014

(54) ENHANCEMENT-MODE NITRIDE TRANSISTOR

(75) Inventors: Bin Lu, Cambridge, MA (US); Tomás Palacios, Cambridge, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 0 days.

(21) Appl. No.: 12/574,146

(22) Filed: Oct. 6, 2009

(65) Prior Publication Data
US 2010/0084688 A1 Apr. 8, 2010

Related U.S. Application Data

(60) Provisional application No. 61/103,008, filed on Oct. 6, 2008.

(51) Int. Cl.
*H01L 29/66* (2006.01)

(52) U.S. Cl.
USPC .................................. 257/194; 257/E29.246

(58) Field of Classification Search
USPC .......................... 257/194, E29.246, E21.403
See application file for complete search history.

(56) References Cited

U.S. PATENT DOCUMENTS

| | | | | |
|---|---|---|---|---|
| 2002/0066908 A1* | 6/2002 | Smith | | 257/194 |
| 2002/0167023 A1* | 11/2002 | Chavarkar et al. | | 257/194 |
| 2004/0004245 A1 | 1/2004 | Forbes et al. | | |
| 2005/0274980 A1* | 12/2005 | Miyoshi | | 257/192 |
| 2006/0077743 A1 | 4/2006 | Jeon et al. | | |
| 2006/0138456 A1* | 6/2006 | Parikh et al. | | 257/194 |
| 2007/0205433 A1* | 9/2007 | Parikh et al. | | 257/192 |
| 2007/0269968 A1 | 11/2007 | Saxler et al. | | |
| 2008/0006871 A1 | 1/2008 | Liao | | |
| 2010/0025730 A1* | 2/2010 | Heikman et al. | | 257/194 |

OTHER PUBLICATIONS

Palacios et al., "Demonstration of a GaN-spacer high electron mobility transistor with low alloy scattering" Phys. Stat sol. (a) 202, No. 5, pp. 837-840.
Huang et al., "Enhancement-Mode n-Channel GaN MOSFETs on p and n-GaN/Sapphire Substrates" IEEE Electron Device Letters, vol. 27, No. 10, Oct. 2006, pp. 796-798.
Palacios et al., "High-performance E-Mode AlGaN/GaN HEMTs" IEEE Electron Device Letters, vol. 27, No. 6, Jun. 2006, pp. 428-430.
Cai et al., "High Performance Enhancement-Mode AlGaN/GaN HEMTs Using Flouride-Based Plasma Treatment" IEEE Electron Device Letters, vol. 26, No. 7, Jul. 2005, pp. 435-437.
Palacios et al., "Nitride-based high electron mobility transistors with a GaN spacer" Applied Physics Letters 89, 2006, pp. 073508-1 to 073508-3.
Recht et al., "Nonalloyed Ohmic Contrasts in AlGaN/GaN HEMTs by Ion Implantation With Reduced Activation Annealing Temperature" IEEE Electron Device Letters, vol. 27, No. 4, Apr. 2006, pp. 205-207.

(Continued)

*Primary Examiner* — Tucker Wright
(74) *Attorney, Agent, or Firm* — Gesmer Updegrove LLP

(57) ABSTRACT

A heterojunction for use in a transistor structure is provided. The heterojunction includes a barrier layer positioned beneath a gate region of the transistor structure. The barrier layer includes nitride-based semiconductor materials. A channel layer provides electrical conduction An intermediate layer near the barrier layer and including nitride-based semiconductor materials having a wider bandgap than the channel layer.

16 Claims, 4 Drawing Sheets

(56) References Cited

OTHER PUBLICATIONS

Ito et al, "Normally-Off AlGaN/GaN HEMTs with Thin InGaN Cap Layer" IEICE Trans. Electron, vol. E91-C, No. 7, Jul. 2008, pp. 989-993.

Lanford et al., "Recessed-gate enhancement-mode GaN HEMT with high threshold voltage" Electronics Letters, Mar. 31, 2005, vol. 41, No. 7, pp. 1-2.

* cited by examiner

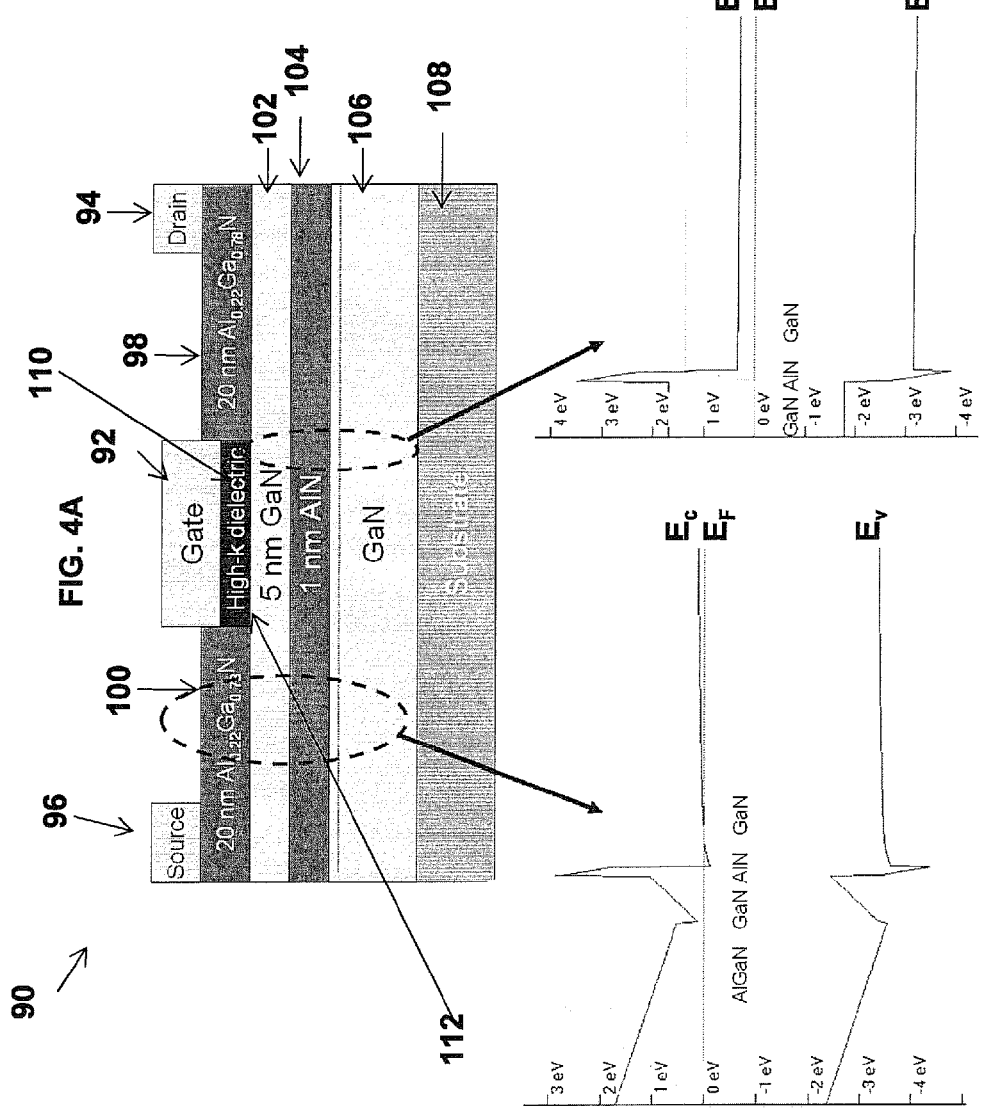

ENHANCEMENT-MODE NITRIDE TRANSISTOR

PRIORITY INFORMATION

This application claims priority from provisional application Ser. No. 61/103,008 filed Oct. 6, 2008, which is incorporated herein by reference in its entirety.

BACKGROUND OF THE INVENTION

The invention is related to the field of high electron mobility transistors (HEMTs), and in particular to a high electron mobility transistor possessing transport properties of a GaN HEMT with the normally-OFF character of a GaN MOSFET with high breakdown voltage.

Nitride-based transistors will play a very important role in solving the energy challenge in the near future. Specifically, power transistors made of these materials are expected to be enabling devices for advanced transportation systems, more robust energy delivery networks and many new revolutionary approaches to high-efficiency electricity generation and conversion. All these systems rely on very efficient inverters to step-up or step-down electric voltages. For example, in hybrid vehicles power transistors with blocking voltages in excess of 1,000 V are needed to step-up the voltage from the batteries to the voltage required to operate the engine. Nowadays, these devices are made of semiconductors such as Si or SiC, however the limited breakdown voltage of Si and the poor mobility of SiC make commercial devices currently available very bulky, heavy and inappropriate for future generations of hybrid vehicles. Nitride devices offer unsurpassed potential high-efficiency power electronics demanding large high-voltages and low ON resistances.

In spite of the tremendous potential of nitride semiconductors in high efficiency power applications, no, commercial device currently exists. However, three different devices are under consideration at the research level. FIG. 1A shows a schematic diagram of a horizontal AlGaN/GaN high electron mobility transistor (HEMT) 2. The transistor 2 includes a gate structure 8 being formed on a AlGaN barrier layer 16. A GaN channel layer 14 is positioned beneath the barrier layer 16. The source 12 and drain 10 are formed in parallel with the barrier layer 16 and channel layer 14. Although this transistor 2 has shown excellent ON resistance and voltage blocking capabilities, the large channel charge densities induced at the interface between the AlGaN barrier layer 16 and GaN channel layer 14 make the fabrication of normally-OFF devices extremely challenging.

FIG. 1B shows a vertical HEMT structure 4. The vertical HEMT structure 4 includes an AlGaN barrier layer 32 formed beneath a gate structure 18. A GaN channel layer 24 is positioned beneath the barrier layer 32 and the drain 26 of the HEMT structure 4. Two source elements 20, 22 are used to define the source of the HEMT structure 4. These source elements 20, 22 are positioned on a dielectric layers 28, 30. The dielectric layer 28,30 are placed within an etched region of the channel layer 24. The vertical HEMT 4 shown in FIG. 1B requires a smaller area than the horizontal HEMT 2 however it is also difficult to fabricate reliable normally-OFF devices.

Another commonly known transistor is the GaN metal-oxide-semiconductor field effect transistor (MOSFET) 6, as shown in FIG. 1C. The GaN-MOSFET 6 includes a gate structure 34 being positioned on a dielectric layer 46. The dielectric layer 46 is formed on a p-type GaN channel layer 44. The drain 36 of the MOSFET 6 is positioned on a n-type GaN layer 40. The n-type GaN layer 40 is formed in a doped region of the p-type GaN channel layer 44. The source 38 is formed on an $n^+$-type GaN layer 38. The $n^+$-type GaN layer 38 is formed in a doped region of the p-type GaN channel layer 44. The GaN metal-oxide-semiconductor field effect transistors (MOSFETs) are the preferred option for normally-OFF devices however the poor transport properties of the inverted channel significantly increases the ON resistance of these devices. None of the three options currently being pursued for power GaN devices is able to combine the high voltage, low ON-resistance and normally-OFF conduction required by the power electronics

SUMMARY OF THE INVENTION

According to one aspect of the invention, there is provided heterojunction for use in a transistor structure. The heterojunction includes a barrier layer positioned beneath a gate region of the transistor structure. The barrier layer includes nitride-based semiconductor materials. A channel layer provides electrical conduction. An intermediate layer is positioned between the barrier layer and channel layer and includes nitride-based semiconductor materials having a wider bandgap than the channel layer which provides electrical conduction. The channel layer is positioned to receive transported electrons at the interface between the channel layer and the intermediate layer.

According to another aspect of the invention, there is provided a transistor structure. The transistor structure includes a heterojunction used in electrical conduction. The heterojunction includes a barrier layer positioned beneath a gate region of the transistor structure. The barrier layer includes nitride-based semiconductor materials. A channel provides electrical conduction. An intermediate layer is positioned between the barrier layer and channel and includes nitride-based semiconductor materials having a wider bandgap than the channel layer which provides electrical conduction. The channel layer is positioned to receive transported electrons at the interface between the channel layer and the intermediate layer. One or more semiconductor structures outside the gate region break the polarization symmetry with respect to the heterojunction underneath the gate so as to form electrical contacts to the transistor structure.

According to another aspect of the invention, there is a provided method of performing electrical conduction in a transistor structure. The method includes positioning a barrier layer beneath the gate region of the transistor. The barrier layer has nitride-based semiconductor materials. Also, the method includes using a channel layer for electrical conduction. The method includes providing an intermediate layer near the barrier layer as well and includes nitride-based semiconductor materials having a wider bandgap than the channel layer. Moreover, the method includes using a channel layer to provide electrical conduction. The channel layer is positioned to receive transported electrons at the interface between the channel layer and intermediate layer.

BRIEF DESCRIPTION OF THE DRAWINGS

FIG. 4A is a schematic diagram illustrating another embodiment of the novel GaN-spacer MOSFET; FIGS. 4B-4C are band diagrams illustrating regions of interest in the GaN-spacer MOSFET of FIG. 4A.

DETAILED DESCRIPTION OF THE INVENTION

The invention involves a novel GaN-based power device (GaN-spacer MOSFET), which combines the excellent transport properties of GaN HEMTs (low ON resistance) with the normally-OFF character of GaN MOSFETs and the high breakdown voltage typical of all GaN devices. The invention can be an enabling step to significantly improve today's energy systems. Some examples of these systems include hybrid vehicles, high efficient solar cells with integrated power inverters and more reliable high power transmission lines controlled and monitored by solid state power electronics.

Figure 1C:
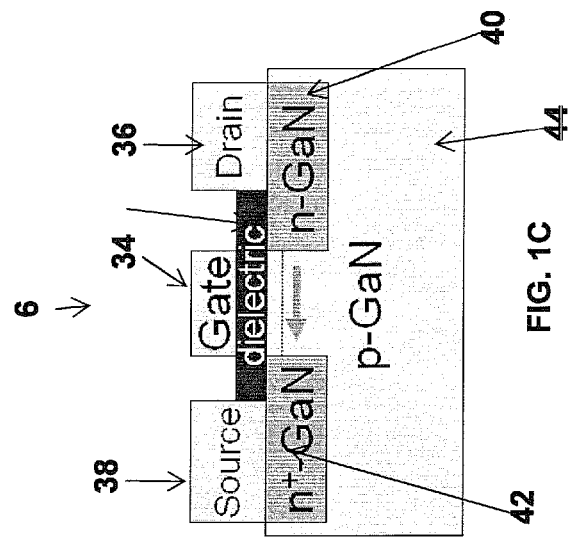
FIGS. 1A-1C are the schematic diagrams illustrating high electron mobility transistors (HEMTs) with lateral and vertical conduction and a GaN-MOSFET respectively.
Figure 1B:
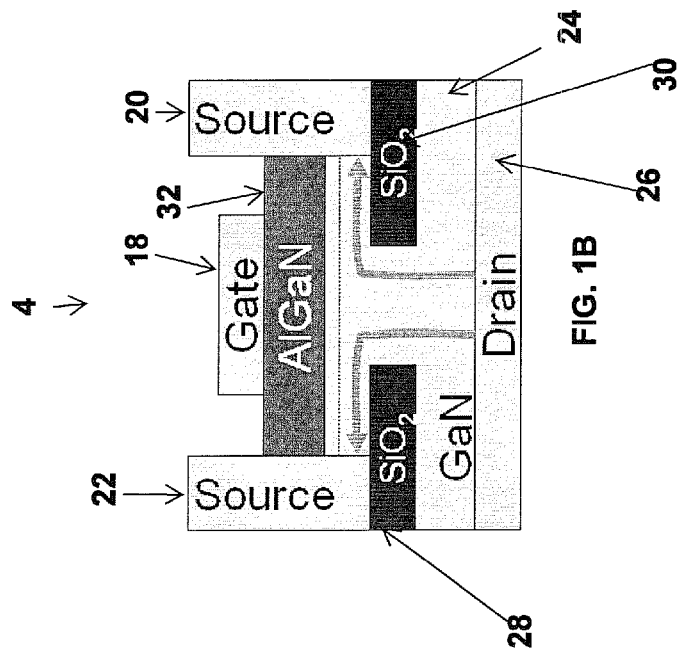
Figure 1A:
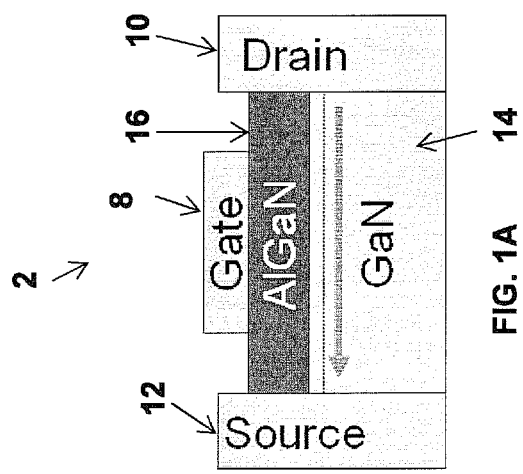
Figure 2:
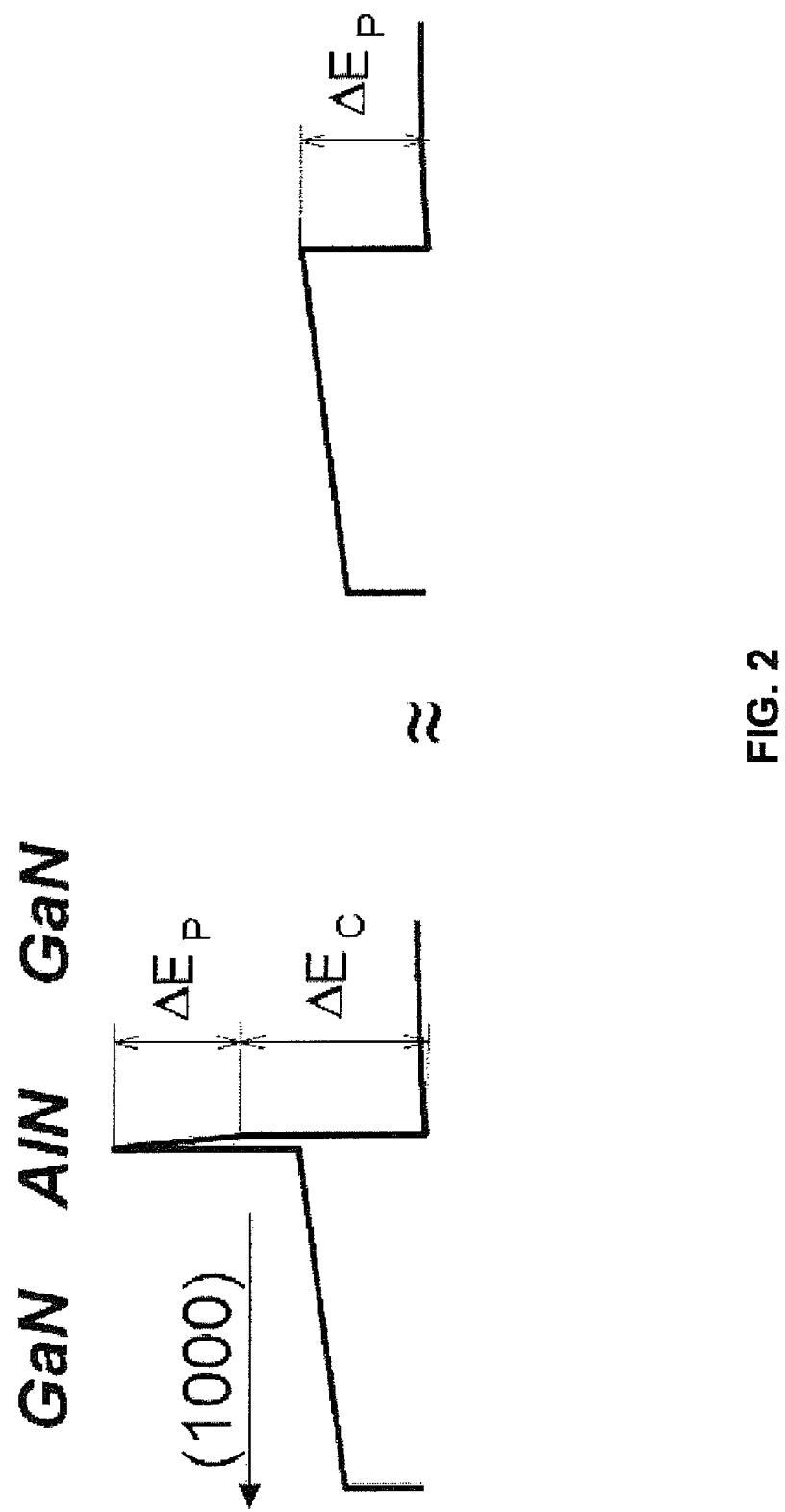
FIG. 2 is a band diagram illustrating the effect of the insertion of an ultra-thin layer of AlN in the conduction band of a GaN buffer.

The inventive GaN-spacer MOSFET is based on a GaN-ultrathin AlN-GaN pseudo-heterojunction. This pseudo-heterojunction is shown in FIG. 2. In this structure, the conduction band discontinuity, $\Delta E_p$, between the two GaN layers 102, 106 depends only on the polarization, field of the AlN layer 104 and it is proportional to the thickness of the AlN ($\Delta E_p$=1.3 eV/nm of AlN). However the AlN layer 104 must be kept as thin as possible in order to reduce its negative effect in the transport properties of the two dimensional electron gas (2DEG). Normally the thickness of the AlN layer 104 is less than 20 Å. It must be noted that in this pseudo-heterojunction, the AlN layer 104 thickness is lower than the critical thickness required to populate the 2DEG with electrons. This arrangement can be used normally as an ON transistor and the channel electrons are provided by doping the GaN-spacer or by inserting a polarization-induced-doping layer above the spacer. However, for power electronics normally OFF devices are strongly preferred and the structure used in this project will be left undoped. In this case the electrons will be electrostatically induced in the channel under the gate by forward biasing the gate electrode.

Figures 3A, 3B:
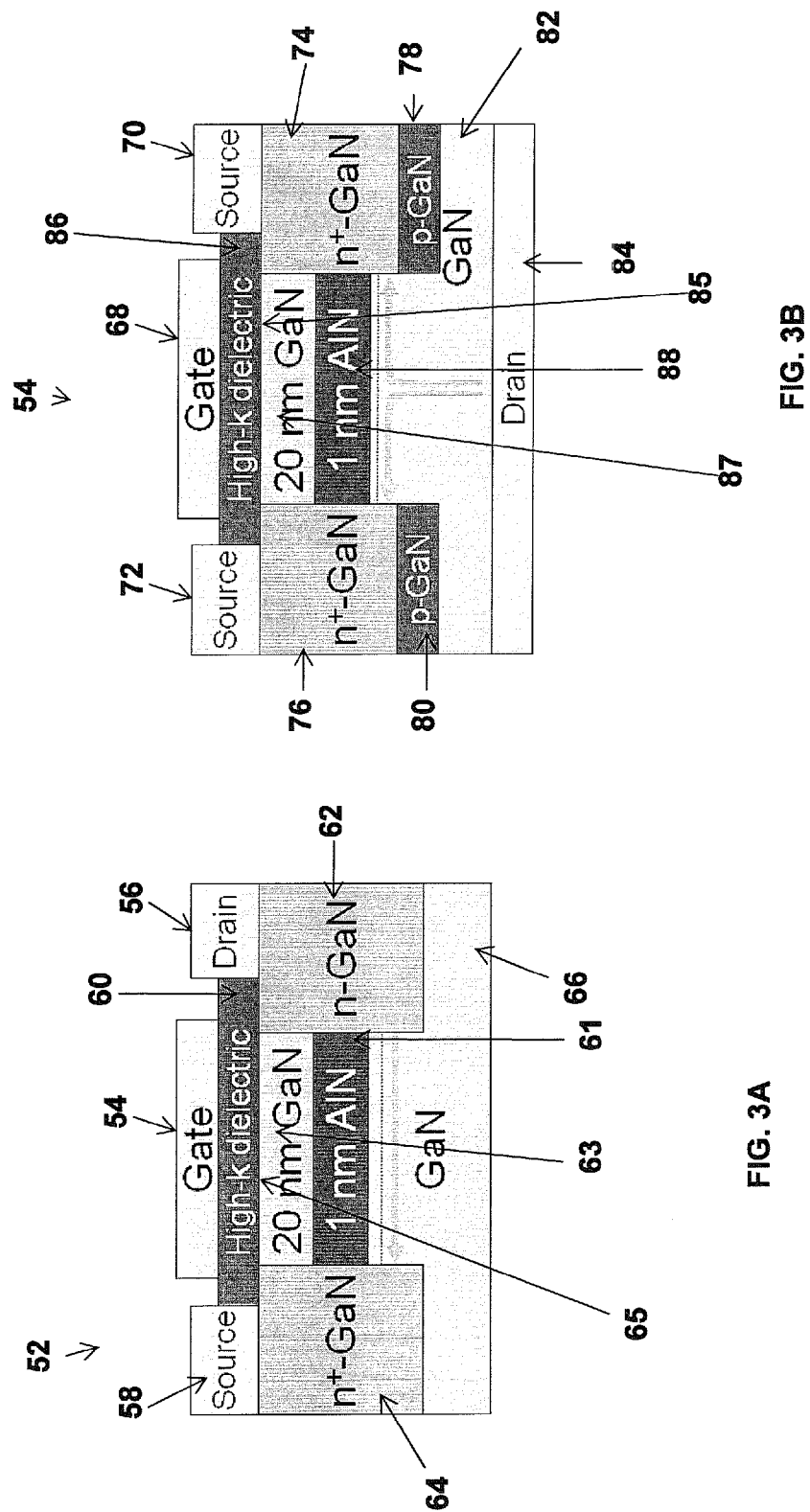
FIGS. 3A and 3B are schematic diagrams illustrating the novel normally-OFF (or enhancement-mode, E-mode) GaN-spacer lateral and vertical MOSFETs respectively.

FIGS. 3A-3B shows two different exemplary embodiments of the inventive GaN-spacer MOSFET having horizontal conduction and vertical conduction. In particular, FIG. 3A illustrates a GaN-spacer MOSFET 52 having horizontal conduction. The GaN-spacer MOSFET 52 includes a gate structure 54 positioned on a high-K dielectric layer 60 to form a gate region 65. Underneath the gate region 65 is a GaN barrier layer 63 having a thickness of 20 nm. The GaN barrier layer 63 is positioned on an AlN intermediate layer 61 having a thickness of 1 nm. The AlN intermediate layer 61 is positioned on a GaN channel layer 66. The polarization of the nitride-based semiconductor materials in the barrier layer 63 must be the same, smaller or in reverse direction as that of the channel layer 66. The source of the GaN-spacer MOSFET 52 is positioned on an n+-type GaN layer 64 and the drain of the GaN-Spacer MOSFET 52 is positioned on an n-type GaN layer 62. The n+-type GaN layer 64 and n-type GaN layer 62 are formed by doping selectively different regions of the channel layer 66 with the appropriate doping type, in this case n+-type and n-type. This breaks symmetry with the barrier layer 63, intermediate layer 61, and channel layer 66 is so as to provide charge outside the gate region 65 to form electrical contacts on said transistor structure 52, such as the source, gate, and drain, outside the gate region 65. Also, the GaN channel layer 66 is formed on an appropriate substrate.

FIG. 3B illustrates a GaN-spacer MOSFET 55 having vertical conduction. The GaN-spacer MOSFET 55 includes a gate structure 68 being positioned on a high-K dielectric layer 86 to form a gate region 85. Underneath the gate region 85 is a GaN barrier layer 87 having a thickness of 20 nm. The GaN barrier layer 87 is positioned on an AlN intermediate layer 88 having a thickness of 1 nm. The AlN intermediate layer 88 is positioned on a GaN channel layer 82. Two source elements 70, 72 are used to form the source of the GaN-spacer MOSFET 55. The source elements 70, 72 are positioned on a n+-type GaN layers 74, 76 respectively. The GaN channel layer 82 is positioned on the drain of the GaN-spacer MOSFET 55. The polarization of the nitride-based semiconductor materials in the barrier layer 87 must be the same, smaller or in reverse direction as that of the channel layer 82. Note the drain is formed on an appropriate substrate. The p-type GaN layers 78, 80 are formed by doping selectively different regions of the channel layer 82 with a p-type dopant. Afterwards, the n+-type GaN layers 74, 76 are formed by doping on top of the p-type GaN layers 78, 80 respectively with a n+-type dopant. This breaks symmetry with the barrier layer 87, intermediate layer 88, and channel layer 82 outside the gate region 85 so as to provide charge outside the gate region 85 to form electrical contacts on said transistor structure 54.

In both GaN-spacer MOSFETs 52, 55, the electron transport occurs at the GaN barrier layer-AlN intermediate layer interface which provides much better transport properties than in the case of the GaN-metal or GaN-oxide interface typical in conventional GaN-spacer MOSFETs. More than 20-fold improvement in mobility has been obtained in preliminary measurements. The use of implantation to fabricate the source and drain contacts allows for control of the charge density in these regions independently of the channel layer under the gate region. The channel layer under the gate region is normally depleted of electrons which make this transistor normally OFF.

FIG. 4A illustrates another exemplary embodiment of the novel GaN-spacer MOSFET 90. The MOSFET 90 includes a gate structure 92 being positioned on a high-K dielectric layer 110 to form a gate region 112. Underneath the gate region 112 is a GaN barrier layer 102 having a thickness of 5 nm. The GaN barrier layer 102 is positioned on an AlN intermediate layer 104 having a thickness of 1 nm. The AlN intermediate layer 104 is positioned on a GaN channel layer 106. The GaN channel layer 106 is formed on a substrate 108. The polarization of the nitride-based semiconductor materials in the barrier layer 102 described must be the same, smaller or in reverse direction as that of the channel layer 106. The source of MOSFET 90 is positioned on an $Al_xGa_{1-x}N$ layer 100 and the drain 94 is positioned on another $Al_xGa_{1-x}N$ layer 98, where x=0.22. The $Al_xGa_{1-x}N$ layers 98, 100 are positioned on the barrier layer 102.

The growth of the $Al_xGa_{1-x}N$ layers 98, 100 on the barrier layer 102 allows for low resistance source and drain regions to be formed. The polarization difference between the $Al_xGa_{1-x}N$ layers 98, 100 and the GaN barrier layer 102 induces an electric field in the $Al_xGa_{1-x}N$ layers 98, 100 which bring electrons from surface states down to the GaN channel layer 106 as shown in the band diagram in FIG. 4B. To preserve the normally-off character of the transistor, the gate region does not include material from the $Al_xGa_{1-x}N$ layers 98, 100 during the gate recess process as shown in FIG. 4A. In this structure, the band diagram in the access regions looks like the one shown in FIG. 4B while underneath the gate region, it is the typical band diagram of a normally-off device as shown in FIG. 4C.

It will be appreciated that the barrier layers 63, 87, 102 and channel layers 66, 82, 106 described herein include GaN but in other embodiments the barrier layers 63, 87, 102 and channel layers 66, 82, 106 can include other nitride-base semiconductor materials. But the polarization of the barrier layers 63, 87, 102 described herein must be the same, smaller or in reverse direction as that of their associated channel layers 66, 82, 106. The thickness of the barrier layers 63, 87, 102 can vary between 2 nm and 250 nm. The thickness of the channel layers 66, 82, 106 can vary between 5 nm and 3 μm. The intermediate layers 61, 88, 104 include AlN but in other embodiments of the invention other nitride-based semiconductor materials can be used having a wider bandgap than their channel layers. Also, the thickness of the intermediate layers 61, 88, 104 can vary between 0.5 nm and 10 nm.

The present invention can also be combined with other techniques such as fluorine plasma treatment under the gate or gate recesses to fabricate normally-off devices.

The invention provides an important impact in power electronics based on nitride transistors. There are many potential applications for this technology and the estimated market size for power transistors is above 10 billion dollars.

Nitride-based semiconductor materials can refer to those semiconducting compounds formed between nitrogen and other elements in the periodic table, usually aluminum (Al), gallium (Ga), and/or indium (In). The term can refer to binary, ternary, and quaternary compounds such as GaN, AlGaN, and AlInGaN, respectively. These compounds have empirical formulas in which one mole of nitrogen is combined with a total of one mole of the other elements. Accordingly, formulas such as $Al_xGa_{1-x}N$, where $0 \leq x \leq 1$ are often used to describe them. For brevity, when the term AlInGaN is used herein without specification of relative percentages of each element, it will be understood to refer to a compound of the general formula $In_xAl_yGa_zN$ where $x+y+z=1$, $0 \leq x \leq 1$, $0 \leq y \leq 1$, $0 \leq z \leq 1$. Thus, as used herein, the term InAlGaN may refer to GaN, InN, AlGaN, AlInN, InGaN, and/or AlInGaN unless otherwise specified or limited. Accordingly, the terms "InAlGaN", "nitride semiconductor", and "nitride-based semiconductor" are used interchangeably throughout this specification.

The transistors 52, 54, 90 can be formed on substrates comprising silicon, sapphire, and silicon carbide being the preferred substrate material, however other embodiments of the present invention may utilize any suitable substrate, such as diamond, GaN, GaAs, InP and the like. In some embodiments, an appropriate buffer layer also may be formed.

The wide bandgap of GaN and the very high current density achievable in AlGaN/GaN HEMTs make this material system almost ideal for power applications. For the same breakdown voltage GaN devices can achieve 4 orders of magnitude lower resistances than Si devices. In spite of the excellent theoretical performance of GaN devices for power applications, the lack of robust normally-off devices has prevented until now the use of GaN in these systems. The invention has the potential to change this situation. Also, the new devices enabled by the invention, such as double gate and ultra-low access resistance transistors, will allow the use of these devices at much higher frequencies and it may even allow the use of these devices in a future beyond-Si digital electronics where both depletion-mode, and enhancement-mode devices are required.

Although the present invention has been shown and described with respect to several preferred embodiments thereof, various changes, omissions and additions to the form and detail thereof, may be made therein, without departing from the spirit and scope of the invention.

What is claimed is:

1. A heterojunction for use in a transistor structure comprising:
   a channel layer for providing electrical conduction;
   a barrier layer positioned on said channel layer, said barrier layer having nitride-based semiconductor materials, said barrier layer comprises nitride-based semiconductor materials of which the polarization is the same, smaller or in reverse direction as that of said channel layer;
   an intermediate layer positioned between said barrier layer and channel layer and including nitride-based semiconductor materials having a wider bandgap than said channel layer;
   a gate region positioned on a gate dielectric material layer covering at least a portion of said barrier layer to preserve the normally-off feature of said transistor structure below the gate region; and
   a carrier-doping layer positioned on said barrier layer outside the gate region to provide carriers in said channel layer outside the gate region.

2. The heterojunction of claim 1, wherein said gate region comprises a gate structure positioned on a silicon oxide, silicon nitride, or high-k dielectric.

3. The heterojunction of claim 1, wherein said barrier layer comprises a thickness between 2 nm and 250 nm.

4. The heterojunction of claim 1, wherein said intermediate layer comprises a thickness between 0.5 nm and 10 nm.

5. The heterojunction of claim 1, wherein said channel layer comprises a thickness between 5nm and 3 μtm.

6. A transistor structure comprising:
   a heterojunction used in electrical conduction, said heterojunction comprising a barrier layer positioned beneath a gate region of said transistor, said barrier layer having nitride-based semiconductor materials;
   a channel layer for providing electrical conduction, said barrier layer comprises nitride-based semiconductor materials of which the polarization is the same, smaller or in reverse direction as that of said channel layer;
   an intermediate layer positioned between said barrier layer and said channel layer and including nitride-based semiconductor materials having a wider bandgap than said channel layer; and
   a gate region positioned on agate dielectric material layer covering at least a portion of said barrier layer to preserve the normally-off feature of said transistor structure below the gate region; and
   a carrier-doping layer positioned on said barrier layer outside the gate region to provide carriers in the said channel layer.

7. The transistor structure of claim 6, said gate region comprise a gate structure positioned on a silicon oxide, silicon nitride, or high-k dielectric.

8. The transistor structure of claim 6, wherein said barrier layer comprises a thickness between 2 nm and 250 nm.

9. The transistor structure of claim 6, wherein said intermediate layer comprises a thickness between 0.5 nm and 10 nm.

10. The transistor structure of claim 6, wherein said channel layer comprises a thickness between 5nm and 3 μm.

11. A method of performing electrical conduction in a transistor structure comprising:
    using a channel layer for providing electrical conduction;
    positioning a barrier layer beneath a gate region of said transistor, said barrier layer having nitride-based semiconductor materials, said barrier layer comprises nitride-based semiconductor materials of which the polarization is the same, smaller or in reverse direction as that of said channel layer;

providing an intermediate layer between the barrier layer and channel layer and including nitride-based semiconductor materials having a wider bandgap than said channel layer; and positioning a gate region on a gate dielectric material layer covering at least a portion of said barrier layer to preserve the normally-off feature of said transistor structure below the gate region; and positioning a carrier-doping layer on said barrier layer outside the gate region to provide carriers in said channel layer.

12. The method of claim 11, wherein said gate region comprises a gate structure positioned on a high-k dielectric, silicon oxide or silicon nitride.

13. The method of claim 11, wherein said barrier layer comprises a thickness between 2 nm and 250 nm.

14. The method of claim 11, wherein said intermediate layer comprises a thickness between 0.5 nm and 10 nm.

15. The method of claim 11, wherein said channel layer comprises a thickness between 5nm and 3 μm.

16. The method of claim 11, wherein said transistor behaves as an enhancement-mode device.

* * * * *